US007337666B2

United States Patent
Mase

(10) Patent No.: US 7,337,666 B2
(45) Date of Patent: Mar. 4, 2008

(54) MOVABLE SENSOR DEVICE

(75) Inventor: Shunji Mase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/365,606

(22) Filed: Mar. 2, 2006

(65) Prior Publication Data
US 2006/0197173 A1  Sep. 7, 2006

(30) Foreign Application Priority Data
Mar. 2, 2005  (JP)  ............................. 2005-057566

(51) Int. Cl.
*G01C 19/00* (2006.01)
*H01L 21/00* (2006.01)
(52) U.S. Cl. ............. 73/504.12; 257/415; 257/417
(58) Field of Classification Search ............ 73/504.04, 73/504.12, 504.14, 504.15, 504.16, 504.13, 73/514.32; 257/414–419
See application file for complete search history.

(56) References Cited

U.S. PATENT DOCUMENTS 6,067,858 A * 5/2000 Clark et al. ............. 73/504.16
6,357,299 B1 * 3/2002 Aigner et al. .............. 73/754
6,465,854 B1 * 10/2002 Muenzel et al. ............ 257/417
6,472,244 B1 * 10/2002 Ferrari et al. ............... 438/53
6,593,663 B2   7/2003 Ikezawa et al.
2003/0049878 A1  3/2003 Offenberg et al.

FOREIGN PATENT DOCUMENTS

JP  A-2000-55667  9/2003

OTHER PUBLICATIONS

Wolf et al., Silicon Processing for the VLSI Era vol. 1: Processing Technology, Lattice Press, Sunset Beach, CA, USA, pp. 151-156, 1986.*

* cited by examiner

*Primary Examiner*—Helen Kwok
(74) *Attorney, Agent, or Firm*—Posz Law Group, PLC

(57) ABSTRACT

A movable sensor device includes a laminate body in which a micromechanical acting layer having a movable sensor structure and a coating layer coated on the micromechanical acting layer is successively laminated on a substrate. A draft portion penetrates through the laminate body in the lamination direction. The draft portion and a residual portion thereof are disposed at a peripheral portion of the movable sensor structure in the laminate body. The residual portion is a thin portion that is smaller in thickness than the laminate body and has a spring function.

5 Claims, 3 Drawing Sheets

MOVABLE SENSOR DEVICE

CROSS REFERENCE TO RELATED APPLICATION

This application is based upon, claims the benefit of priority of, and incorporates by reference the contents of Japanese Patent Application No. 2005-57566 filed on Mar. 2, 2005.

TECHNICAL FIELD

The technical field relates to a movable sensor device having a movable sensor structure such as an angular velocity sensor having a vibrator, an acceleration sensor having a movable electrode or the like.

BACKGROUND

As this type of movable sensor device have been known an angular velocity sensor having as a movable sensor structure an angular velocity detecting structure that has a vibrator and detects an angular velocity, an acceleration sensor having as a movable sensor structure an acceleration detecting structure that has a movable electrode and detects an acceleration, etc.

Such a movable sensor device as described above is fixed to an object to be measured such as a vehicle or the like under the state that it is mounted in a package such as ceramics, metal or the like as a fixing member, for example, and practically used to detect yaw rate, acceleration, etc.

Under the practical use of the movable sensor device as described above, the mobility characteristic and the vibration characteristic of the movable sensor structure are affected by unnecessary vibration from the external or unnecessary vibration of the sensor device itself. Therefore, a vibration isolation structure has been adopted to prevent the movable sensor device from being affected by the unnecessary vibration as described above.

As the vibration isolation structure as described above, vibration isolating rubber for absorbing unnecessary vibration is interposed between the package and the movable sensor device (for example, JP-A-2000-55667; Patent Document 1), or the movable sensor device and the package are fixed to each other by adhesive agent having a vibration isolating agent (for example, JP-A-2003-21647; Patent Document 2).

As this type of movable sensor device has been proposed an MEMS (Micro Electro Mechanical Systems) type movable sensor device that actively uses the silicon semiconductor processing technique (JP-T-2003-530233; Patent Document 3).

This type of movable sensor device has a substrate, a micromechanical acting layer provided on the substrate, a coating layer provided on the micromechanical acting layer and an electrically conductive zone layer provided on the coating layer.

The coating layer has a monocrystalline area and a polycrystalline area, and the monocrystalline area and the polycrystalline area are epitaxially grown on a monocrystalline area and a polycrystalline starting layer that exist under the monocrystalline area and the polycrystalline area, respectively.

Furthermore, the micromechanical acting layer has a monocrystalline area and a polycrystalline area, the monocrystalline area and the polycrystalline area are epitaxially grown on a monocrystalline area and a polycrystalline starting layer that exist under the monocrystalline area and the polycrystalline area, and a movable sensor structure is formed in the polycrystalline area of the micromechanical acting layer.

However, the above-described techniques separately require a vibration isolating function member such as the vibration isolating rubber or the adhesive agent having the vibration isolating function as described above when the movable sensor device is mounted to a fixing member. Therefore, various problems occur such as a cost-up problem caused by increase of the number of parts, degradation of the vibration isolating function due to time-variation of the joint portions of the movable sensor device, the vibration isolating function member and the fixing member or the vibration isolating function member itself, that is, the degradation of the sensor characteristic.

SUMMARY

In view of the foregoing problem, it is an object to provide a movable sensor device having a movable sensor structure that can properly secure a vibration isolating function without requiring any vibration isolating function member as a separate member when the movable sensor device is mounted to a fixing member.

In order to attain the above object, the inventor has paid attention to a movable sensor device comprising a laminate body in which a micromechanical acting layer having a movable sensor structure and a coating layer are successively laminated on a substrate, that is, an MEMS type movable sensor device as described in the Patent Document 3, and has made various studies on the movable sensor device concerned.

As a result the inventor has found that it is possible to make the MEMS type movable sensor device itself have the vibration isolating function. The present invention has been implemented on the basis of the study result as described above.

In order to attain the above object, according to a first aspect of the, a movable sensor device comprises: a laminate body in which a micromechanical acting layer having a movable sensor structure and a coating layer coated on the micromechanical acting layer are successively laminated on a substrate; a draft portion formed so as to penetrate through the laminate body in the lamination direction; and a residual portion of the draft portion, the draft portion and the residual portion being formed at the peripheral portion of the movable sensor structure in the laminate body, and the residual portion being designed to serve as a thin portion that is smaller in thickness than the laminate body and has a spring function.

According to the movable sensor device of the first aspect, when the movable sensor element is mounted to a fixing member, the residual portion having the spring function that is provided to the movable sensor device itself exhibits a vibration isolating function. Furthermore, the residual portion is formed of the same material as the movable sensor device so as to be integral with the movable sensor device. Therefore, there is no joint portion and thus the vibration isolating function can be suppressed from being degraded.

Therefore according to the first aspect, in the movable sensor device having the movable sensor structure, no vibration isolating function member is required as a separate member when the movable sensor device is mounted to the fixing member, and the vibration isolating function can be properly secured.

According to a second aspect, there is provided a movable sensor device comprising a substrate, a micromechanical acting layer provided on the substrate, a coating layer provided on the micromechanical acting layer, and an electrically conductive zone layer provided on the coating layer, wherein the coating layer has a monocrystal area and a polycrystalline area that are epitaxially grown on an monocrystalline area existing under the monocrystal area and on a polycrystalline start layer existing under the polycrystalline area respectively, the micromechanical acting layer has a monocrystal area and a polycrystalline area that are epitaxially grown on an monocrystalline area existing under the monocrystal area and on a polycrystalline start layer existing under the polycrystalline area respectively, and the movable sensor structure is formed in the polycrystalline area of the micromechanical acting layer, wherein a draft portion and a residual portion of the draft portion are formed in the laminate portion constructed by laminating the substrate, the monocrystalline area of the micromechanical acting layer and the monocrystalline area of the coating layer so that the draft portion penetrates through the laminate portion in the lamination direction, and the residual portion is designed to serve as a thin portion smaller in thickness than the laminate portion and has a spring function.

According to this aspect, when the movable sensor device is mounted to the fixing member, the residual portion having the spring function that is provided to the movable sensor device itself exhibits a vibration isolating function, and also the residual portion is formed of the same material as the movable sensor device so as to be integral with the movable sensor device. Therefore, there is no joint portion and thus the degradation of the vibration isolating function can be suppressed.

Therefore, according to the second aspect, in the movable sensor device having the movable sensor structure, no vibration isolating function member is required as a separate member when the movable sensor device is mounted to the fixing member, and the vibration isolating function can be properly secured.

According to a third aspect, in the movable sensor device according to the second aspect, the residual portion is formed as the thin portion by removing the substrate and the monocrystalline area of the micromechanical acting layer in the laminate portion and leaving a part of the monocrystalline area of the coating layer.

According to the third aspect, in the movable sensor device of the second aspect, the coating layer is designed so that one side and the other side of the residual portion are joined to each other through the residual portion (i.e., the residual portion constitutes a part of the coating layer and serves as a bridge for the coating layer). Therefore, in the electrically conductive zone layer formed on the coating layer, the electrical connection between the one side and the other side of the residual portion can be easily implemented through the residual portion.

According to a fourth aspect, in the movable sensor device according to the first to third aspects, the movable sensor structure is an angular velocity detecting structure having a vibrator for detecting an angular velocity. Accordingly, a movable sensor device as an angular velocity sensor can be provided.

DETAILED DESCRIPTION OF THE PREFERRED EMBODIMENTS

Figure 1A:
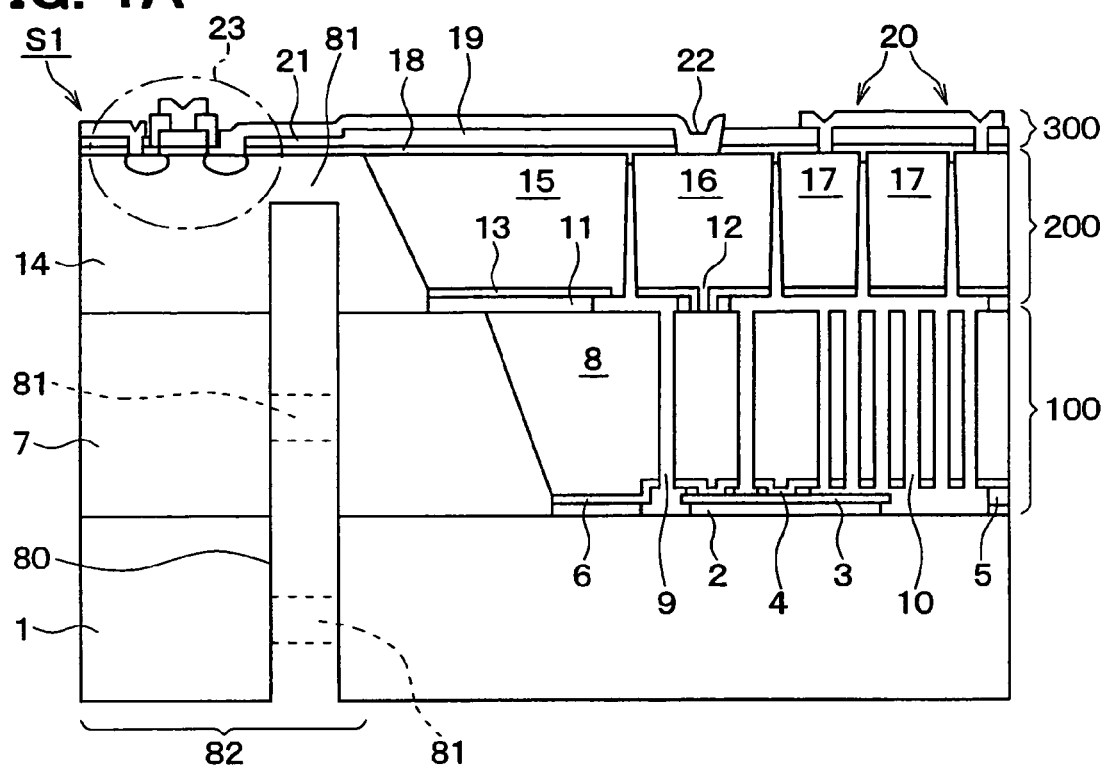
FIG. 1A is a cross-sectional view showing a movable sensor device according to a first embodiment.

A preferred embodiment will be described hereunder with reference to the accompanying drawings. In the drawings, the same or equivalent elements are represented by the same reference numerals in order to simplify the description thereof.

[Construction, etc.]

A movable sensor device S1 mainly comprises a micromechanical acting layer 100 having a movable sensor structure 10, a coating layer 200 for sealing the micromechanical acting layer 100 and an electrically conductive zone layer 300 for forming a wire portion and a circuit portion in the sensor device, which are successively laminated on a substrate 1 to thereby form a laminate body.

The movable sensor device S1 as described above can be manufactured by a well-known silicon surface micromechanism.

Here, the substrate 1 comprises a monocrystal silicon (Si) substrate. The substrate 1 itself is constructed as a monocrystalline area 1.

As shown in FIG. 1A, in the micromechanical acting layer 100, a lower oxide layer 2 is formed on the substrate 1, and a polysilicon layer 3 embedded as a wire layer is formed on the lower oxide layer 2.

A contact hole 4 is formed as an opening portion of a sacrifice oxide layer 5 for releasing a movable sensor structure 10, and the movable sensor structure 10 and the polysilicon layer 3 are conducted to each other through the contact hole 4.

A first start polysilicon layer 6 as a polycrystalline start layer is formed on the sacrifice oxide layer 5.

Furthermore, a first monocrystal silicon layer 7 is epitaxially formed as a monocrystalline area on the substrate 1.

Furthermore, a first epitaxial polysilicon layer 8 as a polycrystalline area is formed on the first start polysilicon layer 6. An insulating trench 9 is formed in the first start polysilicon layer 6 and the first epitaxial polysilicon layer 8, thereby forming the movable sensor structure 10.

As shown in FIG. 1A, a first supplementary oxide layer 11 is formed on the micromechanical acting layer 100 in the coating layer 200. A contact hole 12 is formed as an opening portion in the first supplementary oxide layer 11, and the movable sensor structure 10 and the coating layer 200 are conducted to each other through the contact hole 12.

A second starting polysilicon layer 13 as a polycrystalline starting layer is formed on the first supplementary oxide layer 11. A second monocrystal silicon layer 14 is epitaxially formed as a monocrystalline area on the first monocrystal silicon layer 7.

Furthermore, a second epitaxial polysilicon layer 15 as a polycrystalline area is formed on the second starting polysilicon layer 13.

In the coating layer 200, a part of the second epitaxial polysilicon layer 15 serves as a joint element 16 for establishing the electrical joint and the mechanical joint between the first epitaxial polysilicon layer 8 and the second epitaxial polysilicon layer 15.

Furthermore, in the coating layer 200, a part of the second epitaxial polysilicon layer 15 serves as a groove portion 17. This groove portion 17 functions as an etching hole for removing the lower oxide layer 2, the sacrifice oxide layer 5 and the first supplementary oxide layer 11 located below the groove portion 17 to release the movable sensor structure 10.

Furthermore, as shown in FIG. 1A, a second supplementary oxide layer 18 is formed as a surface layer portion of the coating layer 200, an insulating oxide layer 19 of an electrically conductive zone is formed as the electrically conductive zone layer 300 on the surface layer portion, and an electrically conductive layer 21 formed of aluminum or the like is formed on the insulating oxide layer 19.

Furthermore, in the conductive zone layer 300, a cross joint portion 20, a contact hole 22 for conducting the electrically conductive layer and the joint element 16 of the coating layer 200 are formed by the second supplementary oxide layer 18 and the opening portion of the insulating oxide layer 19 of the electrically conductive zone.

Furthermore, the second monocrystal silicon layer 14 as the monocrystalline area of the coating surface 200 contains an integrated circuit device of an analyzing circuit, and a CMOS transistor 23 as an electrical element of the analysis circuit is shown as an example in FIG. 1A.

In the case of the movable sensor device of this embodiment which can be manufactured by a well-known silicon surface micromechanism, the coating layer 200 has a second monocrystal silicon layer 14 as a monocrystalline area, and the second monocrystal silicon layer 14 is epitaxially grown on the first monocrystal silicon layer 7 as the monocrystalline area existing under the second monocrystal silicon layer 14.

Furthermore, the coating layer 200 has a second epitaxial polysilicon layer 15 as a polycrystalline area, and at the same time the second epitaxial polysilicon layer 15 is epitaxially grown on the second starting polysilicon layer 13 as a polycrystalline start layer existing under the second epitaxial polysilicon layer 15. In other words, the monocrystal silicon and the polycrystal silicon are simultaneously grown in one treatment step.

Likewise, the micromechanical layer 100 has a first monocrystal silicon layer 7 as a monocrystalline area, and the first monocrystal silicon layer 7 is epitaxially grown on the monocrystalline area of the substrate 1 existing under the first monocrystal silicon layer 7.

Furthermore, the micromechanical acting layer 100 has a first epitaxial polysilicon layer 8 as a polycrystalline area, and the first epitaxial polysilicon layer 8 is epitaxially grown on the first start polysilicon layer 6 as a polycrystalline start layer existing under the first epitaxial polysilicon layer 8. This treatment step of Si which executes monocrystal growth and polycrystal growth at the same time is executed for the sensor structure 10 and the coating layer 200.

As described above, since the movable sensor device S1 of this embodiment is constructed by an angular velocity sensor, the movable sensor structure 10 is constructed as an angular velocity detecting structure having a vibrator for detecting the angular velocity.

Next, the movable sensor structure 10 as the angular velocity detecting structure will be described in detail referring to FIG. 2.

Figure 1B:
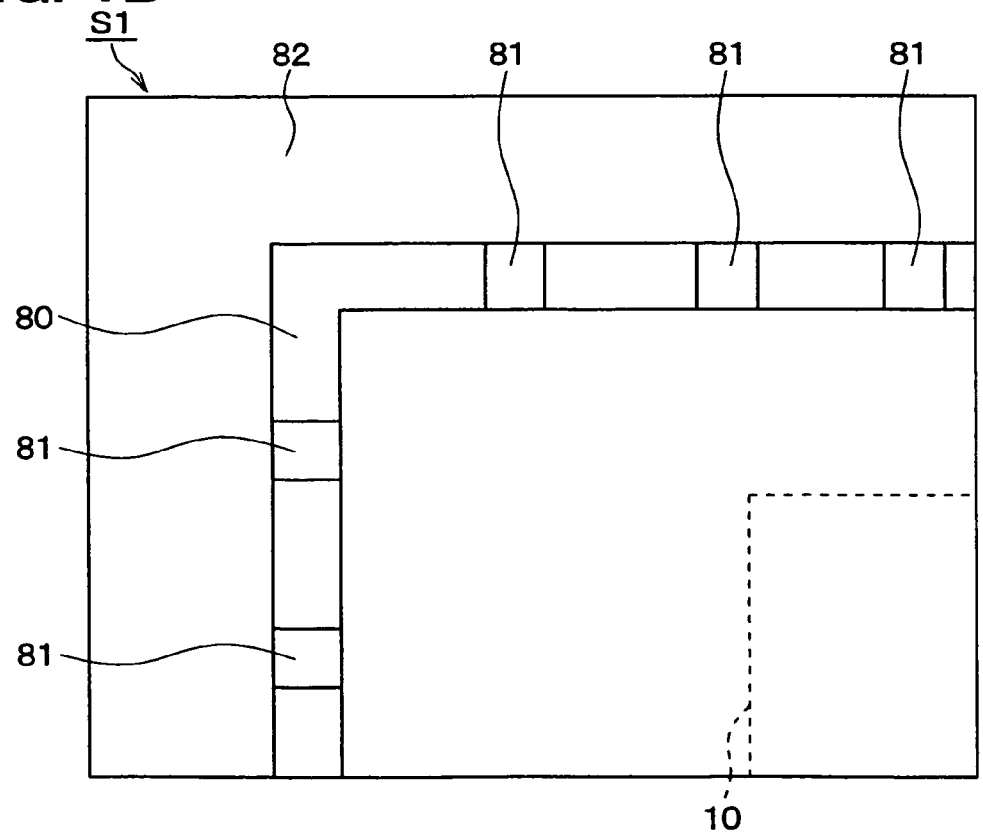
FIG. 1B is a plan view of FIG. 1A which is viewed from the upper side.
Figure 2:
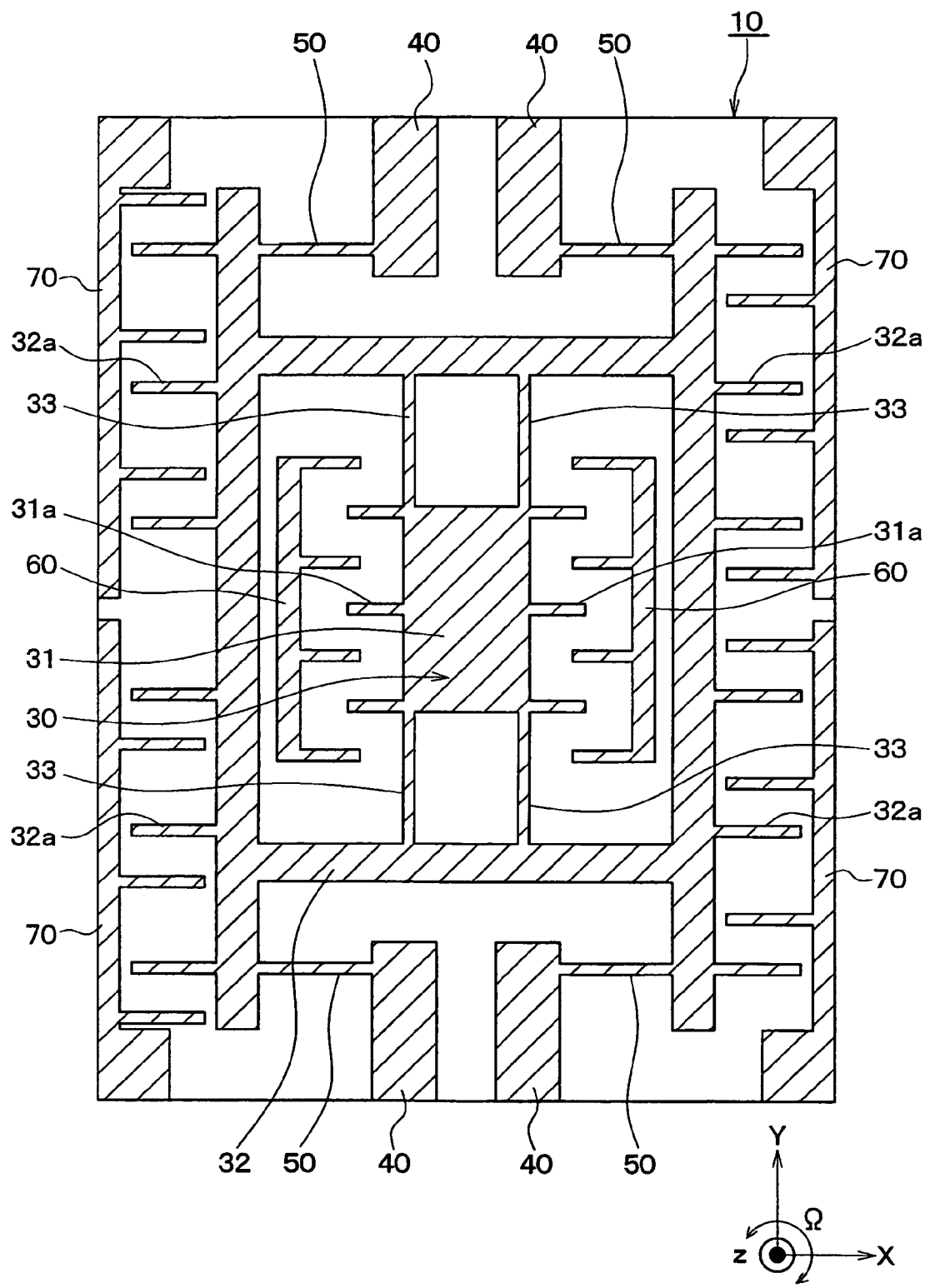
FIG. 2 is a plan view showing a movable sensor structure shown in FIGS. 1A and 1B.

FIG. 2 is a diagram showing the planar construction of the movable sensor structure 10 shown in FIGS. 1A-1B, and shows a planar pattern of the movable sensor structure when the upper constituent elements of the movable sensor structure 10 are seen through the upper side in FIG. 1A.

As described above, the movable sensor structure 10 as the angular velocity detecting structure is formed of the first epitaxial polysilicon layer 8 epitaxially-grown on the patterned first starting polysilicon layer 6 in the micromechanical acting layer 200, and it is released (cleared) from the lower substrate 1 and the upper coating layer 200 by removing the first supplementary oxide layer 11 and the sacrifice oxide layer 5.

In the movable sensor structure 10, beam structures 30 to 70 having an obliquely-hatched planar pattern in FIG. 2 are formed by sectioning the first starting polysilicon layer 6 and the first epitaxial polysilicon layer 8 by grooves.

The beam structures 30 to 70 are mainly constructed by a vibrator 30, respective beam portions 33, 50 and respective electrodes 60, 70.

The vibrator 30 can be vibrated on a plane horizontal to the micromechanical acting layer 200, that is, within the surface of the sheet in FIG. 2.

In this embodiment, the vibrator 30 comprises a substantially rectangular first vibrating portion 31 located at the center portion of FIG. 2, a rectangular frame type second vibrating portion 32 located on the outer periphery of the first vibrating portion 31 and a driving beam portion 33 for joining the first and second vibrating portions 31, 32.

This vibrator 30 is joined to an anchor portion 40 provided at the peripheral portion thereof through a detecting beam portion 50. Here, the anchor portion 40 is fixedly mounted to the lower substrate 1 or the upper coating layer 200 shown in FIG. 1A, and the vibrator 30 is floated from the substrate 1 and the coating layer 200.

Here, by designing the driving beam portion 33 so that the driving beam portion 33 extends in the Y direction as shown in FIG. 2, the driving beam portion 33 is elastically deformable substantially in only the X direction. Furthermore, by designing the detecting beam portion 50 so that the detecting beam portion 50 extends in the X direction, it is elastically deformable substantially in only the Y direction.

The first vibrating portion 32 of the vibrator 30 can be vibrated in the X direction within the horizontal plane (that is, in the driving vibration direction) by the driving beam 33. On the other hand, the whole of the vibrator 30 can be vibrated in the Y direction within the horizontal plane (that is, in the detection vibration direction) by the detecting beam portion 50.

Furthermore, a driving electrode 60 for vibrating the first vibrating portion 31 in the X direction is provided between the first vibrating portion 31 and the second vibrating portion 32.

The driving electrode 60 is fixed to the substrate 1 or the coating layer 200 as in the case of the anchor portion 40. The driving electrode 60 is disposed so as to face the first vibrating portion 31 so that the teeth of the comb-shaped portion thereof are engaged with the teeth of the comb-shaped portion (driving comb-shaped portion) projecting from the first vibrating portion 31.

Furthermore, a detecting electrode 70 for detecting an angular velocity is provided on the outer periphery of the second vibrating portion 32.

The detecting electrode 70 detects the angular velocity around the Z-axis vertical to the micromechanical acting layer 200 on the basis of the vibration of the vibrator 30, and it is fixed to the substrate 1 or the coating layer 200 as in the case of the anchor portion 40. The detecting electrode 70 is disposed so as to face the second vibrating portion 32 so that the teeth of the comb-shaped portion thereof are engaged with the teeth of the comb-shaped portion (detecting comb-shaped portion) 32a projecting from the second vibrating portion 32.

Furthermore, the movable sensor structure 10 is conducted to the contact holes 4 and 12 (see FIG. 1) at suitable positions of the anchor portion 40 and the detecting electrode 70 so that the movable sensor structure 10 is electrically connected to the other portions.

Accordingly, a voltage can be applied to the vibrator 30, the driving electrode 60 and the detecting electrode 70 from the circuit portion provided to the movable sensor device S1 or an external circuit, and signals can be taken out from the movable sensor structure 10.

The basic detecting operation of the angular velocity by the movable sensor structure 10 as an angular velocity detecting structure as described above will be described with reference to FIG. 2.

A driving signal such as a sine wave voltage or the like is applied to the driving electrode 60 to generate electrostatic force between the comb-shaped portion 31a of the first vibrating portion 31 and the driving electrode 60. Accordingly, the first vibrating portion 31 is vibrated in the X direction by the elastic force of the driving beam portion 33.

When the angular velocity Ω is applied around the Z axis under the driving vibration of the first vibrating portion 31, Coriolis force is applied to the first vibrating portion 31 in the Y direction, and the whole vibrator 30 is vibrated (detection-vibrated) in the Y direction by the elastic force of the detecting beam 50. Accordingly, the capacitance between the comb teeth of the detecting electrode 70 and the detecting comb-shaped portion 32a is varied by the detection vibration, and thus the magnitude of the angular velocity Ω can be determined by detecting the capacitance variation.

Specifically, the left-side detecting electrode 70 and the right-side detecting electrode 70 are set so that the capacitance variations thereof are opposite to each other when the vibrator 30 is displaced in one direction along the Y axis direction in FIG. 2. Therefore, the capacitance variations of the right and left detecting electrodes 70 are converted to the corresponding voltages, and both the voltage values are differentiated, amplified and outputted to thereby determine the angular velocity.

As described above, the movable sensor device S1 of this embodiment comprises the laminate body in which the micromechanical acting layer 100 having the movable sensor structure 10 and the coating layer 200 coated on the micromechanical acting layer 100 are successively laminated on the substrate 1.

As shown in FIGS. 1A and 1B, in the movable sensor device S1 comprising the laminate body as described above, a draft portion 80 penetrating through the laminate body in the lamination direction (in the vertical direction in FIG. 1A) and the residual portions 81 of the draft portion 80 are formed at the peripheral portion 82 of the movable sensor structure 10 of the laminate body.

Here, the residual portions 81 are formed by keeping a part of the draft portion 80 from penetrating through the laminate body in the lamination direction and thus leave the part concerned. Each residual portion 81 is designed as a thin portion smaller in thickness than the laminate body so that it has a spring function. Specifically, the residual portion 81 serves to attenuate the vibration of the vibrator 30 of the movable sensor structure 10 and to attenuate the vibration from the external.

Furthermore, as shown in FIG. 1B, a part of the movable sensor device S1 in which the movable sensor structure 10 is provided (i.e., the inner part of the movable sensor device S1 located at the inner side with respect to the draft portion 80 and the residual portions 81 in FIG. 1B) is joined through the residual portions 81 having the spring function to the other part of the movable sensor device S1 at the opposite side to the inner part of the movable sensor device S1 (i.e., the outer part of the movable sensor device S1 located at the outside with respect to the draft portion 80 and the residual portions 81 in FIG. 1B) so that the inner part of the movable sensor device S1 is suspended by the residual portions 81. As described above, the movable sensor device S1 of this embodiment has the unique structure containing the draft portions 80 and the residual portions 81.

This unique structure will be described in more detail. As shown in FIGS. 1A and 1B, the draft portion 82 penetrating through the laminate portion 82 in the lamination direction (in the vertical direction of FIG. 1A) and the residual portions 81 of the draft portion 80 are formed at the peripheral portion 82 of the movable sensor structure 10, that is, at the laminate portion 82 in which the substrate 1, the monocrystalline area 7 of the micromechanical acting layer 100 and the monocrystalline area 14 of the coating layer 200 are laminated, and the residual portions 81 are designed to be thinner than the laminate portion 82 and have a spring function.

In the embodiment shown in FIGS. 1A and 1B, the substrate 1 and the monocrystalline area 7 of the micromechanical acting layer 100 in the laminate portion 82 are removed, and a part of the monocrystalline area 14 of the coating layer 200 is left, thereby forming the thin portions.

As described above, in the movable sensor device S1 of this embodiment, the coating layer 200 is designed so that one side and the other side of the residual portion 81 are joined to each other through the residual portion 81. The electrical connection between one side and the other side of the residual portion 81 is implemented through the residual portion 81 in the electrically conductive zone layer 300 as the wire portion and the circuit portion formed on the coating layer 200.

The draft portion 80 as described above can be formed by chemical processing such as photoetching or the like, physical processing such as blade-based dicing or the like or the composite processing thereof. By partially stopping the perforating processing of the draft portion 80 at some midpoint thereof, the residual portions 81 having the spring function can be formed so as to have any width, length and thickness.

Furthermore, in the embodiment shown in FIG. 1, a part of the monocrystalline area 14 of the coating layer 200 is left to form the residual portions 81. The perforation processing may be advanced in the downward direction or in the upward direction in FIG. 1A during the processing of the draft portion 80. That is, if possible, the residual portions 81 may be formed by leaving a part of the substrate 1 in the laminate portion 82 or a part of the monocrystalline area 7 of the micromechanical acting layer as indicated by broken lines of FIG. 1A. Furthermore, all of two or three of the three types of residual portions 81 containing the residual portions 81 indicated by the broken lines may be simultaneously formed.

[Manufacturing Method, etc.]

Figure 3A:
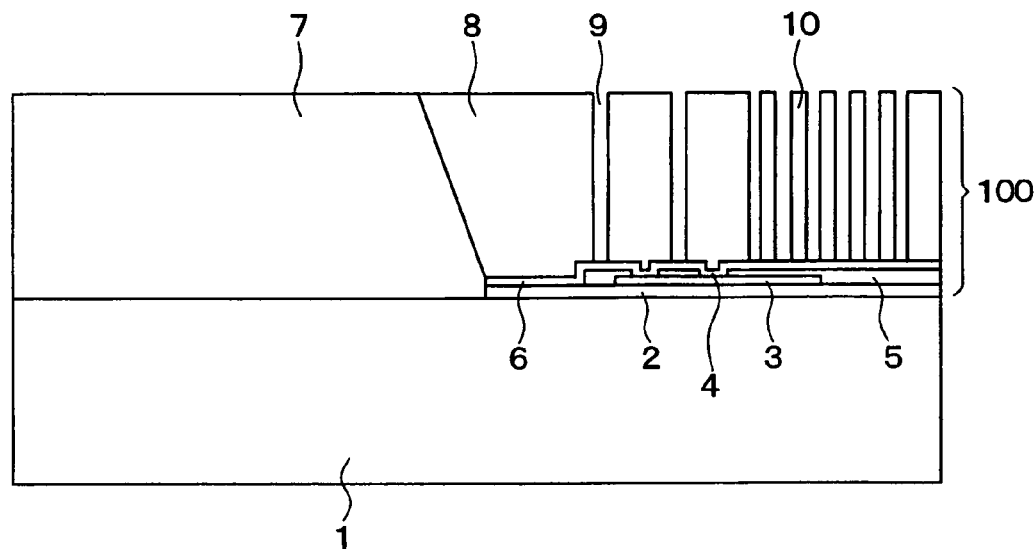
FIGS. 3A and 3B are cross-sectional views showing a manufacturing process of the movable sensor device shown in FIG. 1.
Figure 3B:
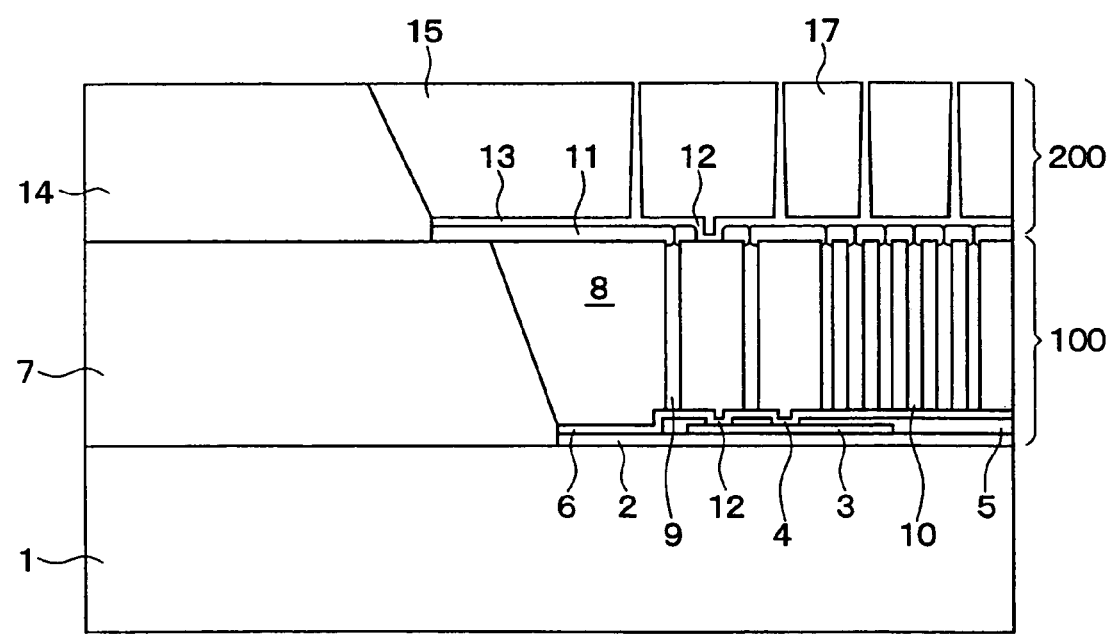

Next, the method of manufacturing the movable sensor device S1 shown in FIGS. 1A-1B will be described. FIGS. 3A and 3B are cross-sectional views showing the manufacturing process of the movable sensor device S1.

In this embodiment, a substrate 1 formed of monocrystal silicon is prepared and the manufacturing process is started.

[Step of FIG. 3A]

The substrate 1 is oxidized to form the lower oxide layer 2. Subsequently, the polysilicon layer 3 embedded as the lower electrically conductive zone area is deposited and patterned. Then, the sacrifice oxide layer 5 is deposited and patterned.

Thereafter, the first starting polysilicon 6 is deposited and patterned, and then the first starting polysilicon layer 6 and the lower oxide layer 2 are removed at the place where the first monocrystal silicon layer 7 will be grown on the substrate 1 in the subsequent epitaxy step.

Thereafter, the epitaxy step of growing the first monocrystal silicon layer 7 together with the first epitaxial polysilicon layer 8 of the micromechanical acting layer 100 is carried out. As described above, the micromechanical acting layer 100 having the movable sensor structure 10 can be completed.

[Step of FIG. 3B]

Subsequently, the first supplementary oxide layer 11 is deposited and the supplementary oxide layer 11 is patterned to form the contact hole 12.

Subsequently, the second starting polysilicon layer 13 is deposited, and subjected to patterning together with the first supplementary oxide layer 11 to remove the first supplementary oxide layer 11 from the place where the second monocrystal silicon layer 14 will be grown on the monocrystal silicon layer 7.

Thereafter, the epitaxy processing of depositing the second epitaxial polysilicon layer 15 of the coating layer 200 simultaneously with the second monocrystal silicon layer 14 is carried out.

Subsequently, the groove portion 17 is formed in the second epitaxial polysilicon layer 15, and this is used as an etching hole for removing the oxide layers 1, 5, 11 formed at the lower side.

Subsequently, the sacrifice layer etching using HF vapor or the like is conducted through the groove portion 17 to remove the lower oxide layer 2, the sacrifice oxide layer 5 and the first supplementary oxide layer 11, thereby conducting the release (clearance) of the movable sensor structure 10.

Thereafter, the deposition and patterning of the second supplementary oxide layer 18 are performed. Furthermore, in the second monocrystal silicon layer 14, IC processing for forming an integrated circuit device such as an analysis circuit, for example, CMOS processing, BiCMOS processing or the like is conducted.

Thereafter, the electrically conductive zone layer 300 is formed, particularly the insulating oxide layer 19 and the electrically conductive layer of the electrically conductive zone are deposited and patterned.

Thereafter, the draft portion 80 penetrating through the laminate body in the lamination direction (in the vertical direction of FIG. 1A) and the residual portions 81 of the drift portion 80 are formed at the peripheral portion 82 of the movable sensor structure 10 of the laminate body according to the chemical processing method such as photoetching or the like or the physical processing method such as dicing or the like.

The respective steps as described above are normally executed on wafer, and dicing cut is conducted on wafer as in the case of a normal standard IC device or the like, whereby the movable sensor device S1 shown in FIG. 1 is completed.

[Effect, etc.]

As described above, the movable sensor device S1 of this embodiment has the following basic constructions.

(1) The movable sensor device S1 has the substrate 1, the micromechanical acting layer 100 provided on the substrate 1, the coating layer 200 provided on the micromechanical acting layer 100 and the electrically conductive zone layer 300 provided on the coating layer 200.

(2) The coating layer 200 has the monocrystal silicon layer 14 and the epitaxial polysilicon layer 15, and the monocrystal silicon layer 14 and the epitaxial polysilicon layer 15 are epitaxially grown on the monocrystal silicon layer 7 and the starting polysilicon layer 13 that exist under the monocrystal silicon layer 14 and the epitaxial polysilicon layer 15 respectively.

(3) The micromechanical acting layer 100 has the monocrystal silicon layer 7 and the epitaxial polysilicon layer 8, the monocrystal silicon layer 7 and the epitaxial polysilicon layer 8 of the micromechanical acting layer 100 are epitaxially grown on the monocrystal silicon substrate 1 and the start polysilicon layer 6 that exist under the monocrystal silicon layer 7 and the epitaxial polysilicon layer 8 respectively, and the movable sensor structure 10 is formed in the epitaxial polysilicon layer 8 of the micromechanical acting layer 10.

The movable sensor device S1 of this embodiment having the above basic construction has the following unique features.

That is, according to the movable sensor device S1 of this embodiment, the draft portion 80 penetrating through the laminate portion 82 in the lamination direction and the residual portions 81 of the draft portion 80 are formed in the laminate portion 82 in which the substrate 1, the monocrystal silicon layer 7 of the micromechanical acting layer 100 and the monocrystal silicon layer 14 of the coating layer 200 are laminated, and each of the residual portions 81 is designed as a thin portion which is smaller in thickness than the laminate body and has a spring function.

In other words, according to this embodiment, in the movable sensor device comprising the laminate body in which the micromechanical acting layer 100 having the movable sensor structure 10 and the coating layer 200 to be coated on the micromechanical acting layer 100 are successively laminated, the draft portion 80 formed so as to penetrate through the laminate body in the lamination direction and the residual portions 81 of the drift portion 80 are formed at the peripheral portion of the movable sensor structure 10 of the laminate body, and the residual portions 81 are designed as thin portions that are smaller in thickness than the laminate body and have a spring function.

According to the movable sensor device S1, when the movable sensor device S1 is fixed to the fixing member such as a package of ceramic material, metal or the like, the residual portions 81 that are provided to the movable sensor device S1 itself and have the spring function exhibit the vibration isolating function.

The residual portions 81 are formed of the same material as the movable sensor device S1, and in this embodiment, it is formed of silicon so as to be integral with the device. Accordingly, the movable sensor device S1 of this embodiment does not have any joint portion between the vibration isolating function member and the partner member (that is, the sensor device, the fixing member) which occurs in the case where a vibration isolating function member such as vibration isolation rubber or adhesive agent is separately used.

Furthermore, according to this embodiment, the residual portions 81 are formed as the vibration isolating function member, and thus the time-lapse degradation can be more greatly suppressed as compared with the prior art. Therefore, according to this embodiment, the degradation of the vibration isolating function can be suppressed.

As described above, according to this embodiment, when the movable sensor device S1 having the movable sensor structure 10 is mounted to the fixing member, there is not required any vibration isolating function member as a separate member, and the proper vibration isolating function can be secured.

Therefore, when the movable sensor device S1 of this embodiment is mounted to the fixing member such as a package or the like, the peripheral portion of the sensor device S1, that is, the portion of the movable sensor device S1 of FIG. 1 which is located at the opposite side to the movable sensor structure 10 side with respect to the draft portion 80 and the residual portions 81 in the movable sensor device S1 of FIG. 1 may be fixed to the fixing member through no vibration isolating function member as in the case of the prior art.

That is, the movable sensor device S1 of this embodiment does not require any fixing member having the vibration isolating function when it is fixed to the fixing member, and it may be fixed through general adhesive agent or joint member.

According to this embodiment, the cost-up which is caused by separately using the vibration isolating function member can be prevented and the proper vibration isolating function can be secured, so that the sensor characteristic can be secured with an inexpensive construction.

Furthermore, according to the movable sensor device S1 shown in FIG. 1, the residual portions 81 are formed as thin-walled portions by removing the substrate 1 and the monocrystal silicon layer 7 of the micromechanical acting layer 100 in the laminate portion 82 so that a part of the monocrystal silicon layer 14 of the coating layer 200 is left.

As described above, the coating layer 200 is designed so that one side and the other side of the residual portion 81 are joined to each other through the residual portion 81, and thus the electrical connection between one side and the other side of the residual portion 81 can be easily performed through the residual portion 81 in the electrically conductive zone layer 300 formed on the coating layer 200. Therefore, the movable sensor device of this embodiment is preferable.

OTHER EMBODIMENTS

The movable sensor device shown in the figures is an embodiment of the present invention, and thus the present invention is not limited to the embodiments shown in the figures. For example, the present invention is applicable to the sensor device having the multilayer structure using the SOI substrate disclosed in the Patent Document 3.

In this embodiment, the movable sensor device of the present invention has been described by exemplifying the angular sensor in which the angular velocity detecting structure having the vibrator for detecting the angular velocity is provided as the movable sensor structure, however, the movable sensor device of the present invention is not limited to the angular sensor.

For example, the present invention may be applied to an acceleration sensor having an acceleration detecting structure having a movable electrode for detecting an acceleration as a movable sensor structure.

In short, according to the main feature of the present invention, in a movable sensor device comprising a laminate body in which a micromechanical acting layer having a movable sensor structure and a coating layer to be coated on the micromechanical acting layer are successively laminated on a substrate, a draft portion penetrating through the laminate body in the lamination direction and residual portions of the draft portion are formed at the peripheral portion of the movable sensor structure of the laminate body, and the residual portions are designed as thin-walled portions that are smaller in thickness than the laminate body and have a spring function. The other portions may be suitably changed in design.

What is claimed is:

1. A movable sensor device comprising:
   a laminate body in which a micromechanical acting layer having a movable sensor structure and a coating layer coated on the micromechanical acting layer is successively laminated on a substrate;
   a draft portion penetrating through the laminate body in a lamination direction; and
   a residual portion of the draft portion, wherein the draft portion and the residual portion are disposed at a peripheral portion of the movable sensor structure in the laminate body,
   wherein the residual portion is a thin portion that is smaller in thickness than the laminate body and has a spring function for attenuating external vibration, and
   wherein the residual portion supports an inner part of the laminate body surrounded by the draft portion.

2. A movable sensor device comprising:
   a substrate;
   a micromechanical acting layer provided on the substrate;
   a coating layer provided on the micromechanical acting layer; and
   an electrically conductive zone layer provided on the coating layer,
   wherein the coating layer has a monocrystal area and a polycrystalline area that are epitaxially grown on an monocrystalline area existing under the monocrystal area and on a polycrystalline start layer existing under the polycrystalline area respectively,
   wherein the micromechanical acting layer has a monocrystal area and a polycrystalline area that are epitaxially grown on an monocrystalline area existing under the monocrystal area and on a polycrystalline start layer existing under the polycrystalline area respectively,
   wherein a movable sensor structure is formed in the polycrystalline area of the micromechanical acting layer,
   wherein a draft portion and a residual portion of the draft portion are formed in a laminate portion constructed by laminating the substrate, the monocrystalline area of the micromechanical acting layer and the monocrystalline area of the coating layer so that the draft portion penetrates through the laminate portion in a direction of the laminating,
   wherein the residual portion is designed to serve as a thin portion smaller in thickness than the laminate portion and has a spring function for attenuating external vibration, and
   wherein the residual portion supports an inner part of the laminate body surrounded by the draft portion.

3. The movable sensor device according to claim 2, wherein the residual portion is formed as the thin portion by removing the substrate and the monocrystalline area of the micromechanical acting layer in the laminate portion and leaving a part of the monocrystalline area of the coating layer.

4. The movable sensor device according to claim 2, wherein the movable sensor structure is an angular velocity detecting structure having a vibrator for detecting an angular velocity.

5. The movable sensor device according to claim 1, wherein the movable sensor structure is an angular velocity detecting structure having a vibrator for detecting an angular velocity.

* * * * *